(12) United States Patent
Kawada

(10) Patent No.: US 8,220,696 B2
(45) Date of Patent: Jul. 17, 2012

(54) MANUFACTURING METHOD OF PRINTED WIRING BOARD AND A LAMINATE JOINTING APPARATUS

(75) Inventor: Hideya Kawada, Ibi-gun (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 436 days.

(21) Appl. No.: 11/519,885

(22) Filed: Sep. 13, 2006

(65) Prior Publication Data

US 2008/0223502 A1   Sep. 18, 2008

(51) Int. Cl.
*B23K 1/06* (2006.01)
(52) U.S. Cl. ............... 228/179.1; 228/110.1; 228/1.1; 228/5.7
(58) Field of Classification Search ............ 228/110.1, 228/1.1; 156/557, 324; 428/457–468
See application file for complete search history.

(56) References Cited

U.S. PATENT DOCUMENTS

| | | | | |
|---|---|---|---|---|
| 4,591,087 A | * | 5/1986 | Frasch | 228/110.1 |
| 5,465,898 A | * | 11/1995 | Schulz-Harder et al. | 228/122.1 |
| 5,942,314 A | * | 8/1999 | Fisher et al. | 428/198 |
| 7,339,118 B1 | * | 3/2008 | Takada et al. | 174/255 |

FOREIGN PATENT DOCUMENTS

| | | |
|---|---|---|
| JP | 05-111715 | 5/1993 |
| JP | 2002-141659 | 5/2002 |
| JP | 2004-148373 | 5/2004 |
| JP | 2005-197295 | 7/2005 |
| JP | 2005223054 A * | 8/2005 |
| JP | 2006-222172 | 8/2006 |

OTHER PUBLICATIONS

Machine translation of JP 2005-223054. Published Aug. 2005.*

* cited by examiner

*Primary Examiner* — David Sample
*Assistant Examiner* — Megha Mehta
(74) *Attorney, Agent, or Firm* — Oblon, Spivak, McClelland, Maier & Neustadt, L.L.P.

(57) ABSTRACT

This invention provides a manufacturing method of printed wiring board which enables a plate-like substrate to be carried and processed without any contact to its product surface. End portions of plate-like copper clad laminates are overlapped vertically and then joined linearly by rotating an ultrasonic horn along the end portions. Consequently, copper foils can be metal-joined and a joining strength necessary for transportation with a roller is obtained. Because belt-like copper clad laminate is obtained by joining the plate-like copper clad laminates and after that, processed, thus, the belt-like copper clad laminate can be carried without any contact to its product surface as it is carried with the roller, and then processed.

19 Claims, 14 Drawing Sheets

Fig. 9
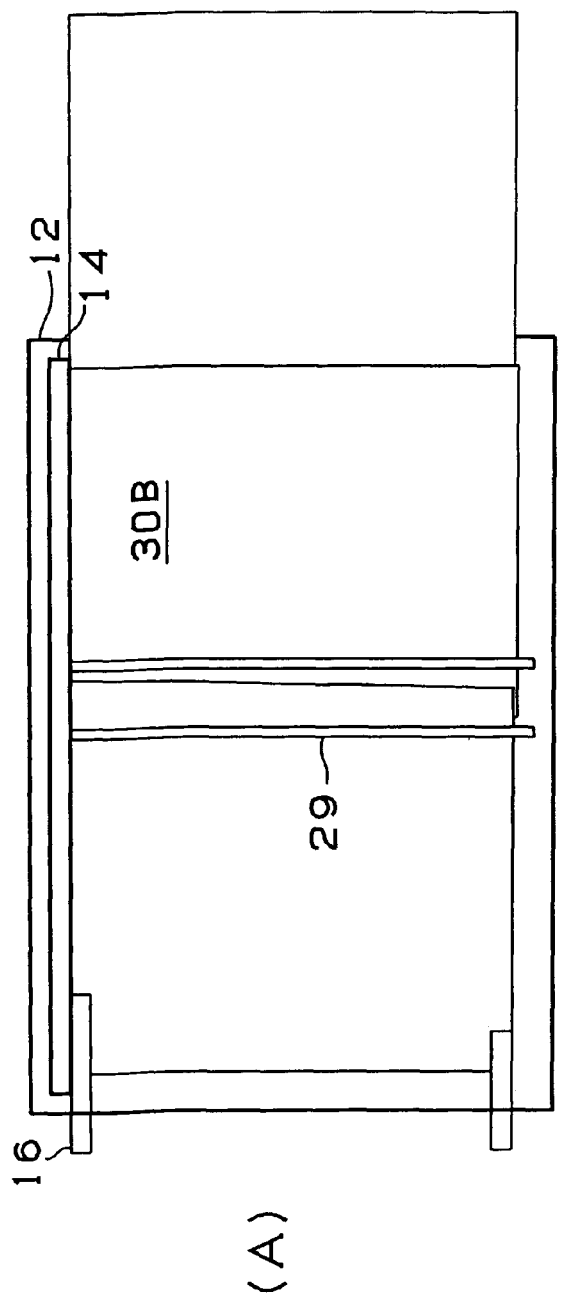
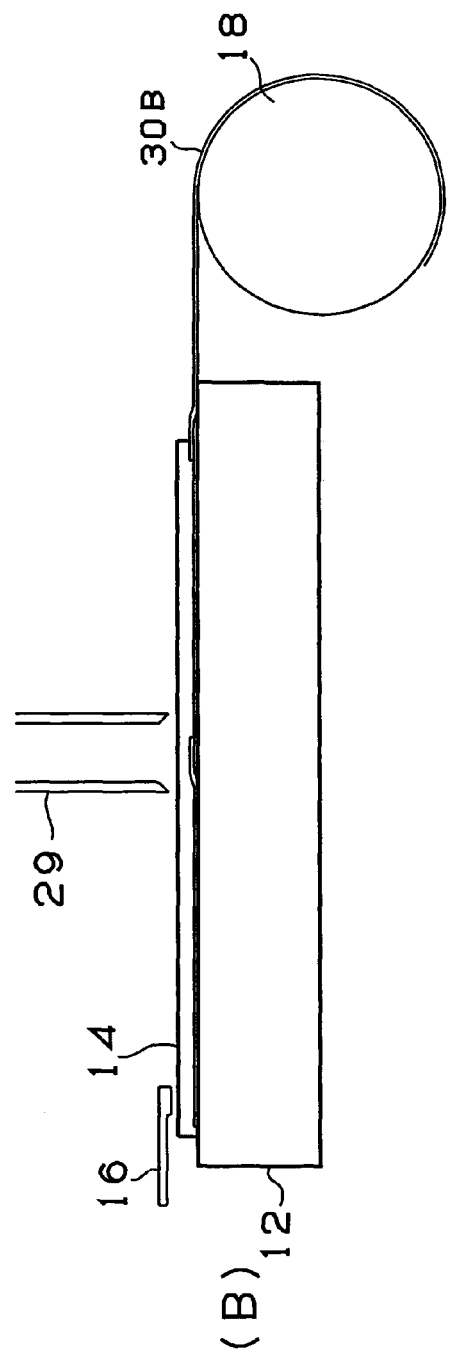

Fig. 10
(A)
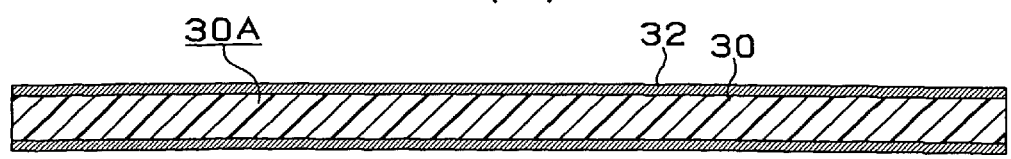
(B)
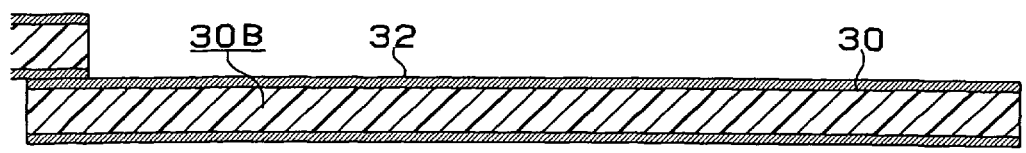
(C)
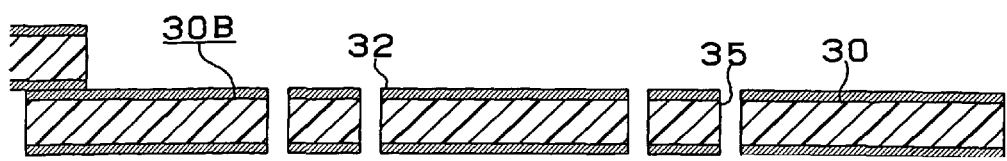
(D)
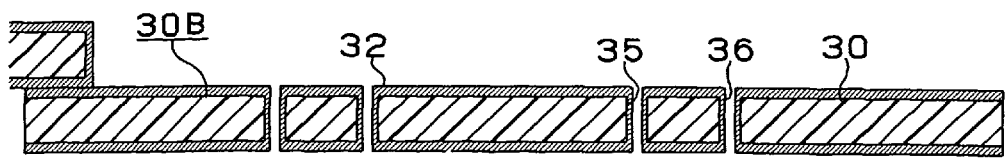

Fig. 11
(A)
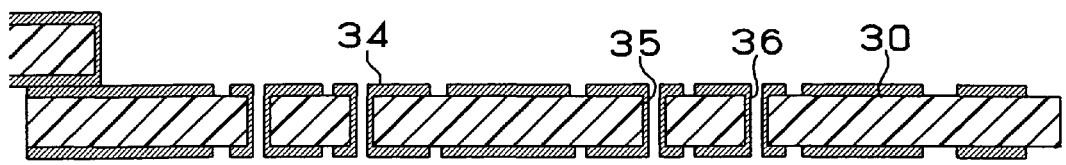
(B)
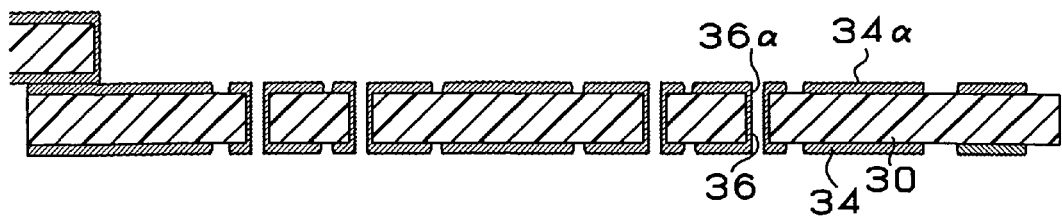
(C)
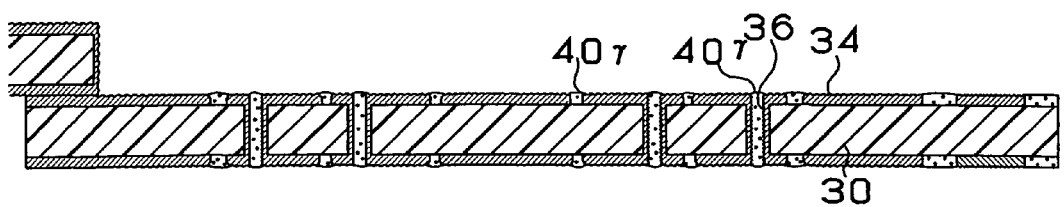

Fig. 12
(A)
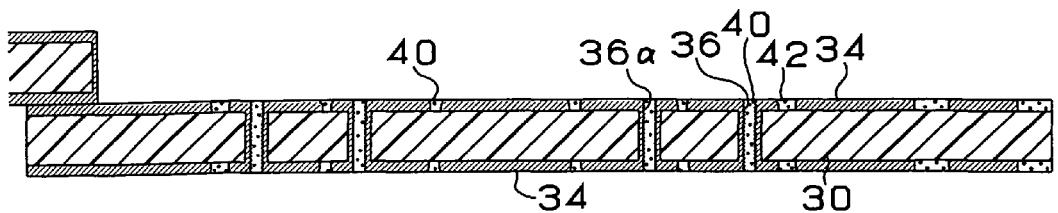
(B)
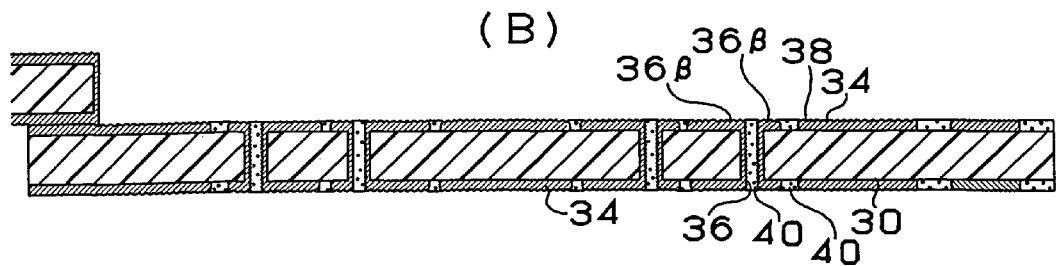
(C)
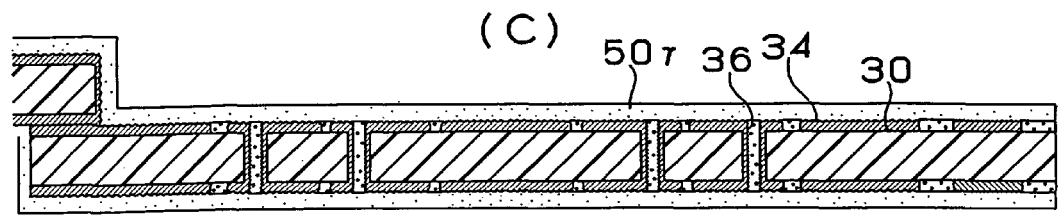
(D)
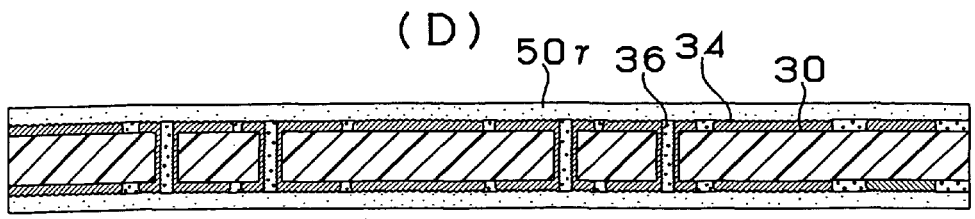

MANUFACTURING METHOD OF PRINTED WIRING BOARD AND A LAMINATE JOINTING APPARATUS

BACKGROUND OF THE INVENTION

1. Field of the Invention

The present invention relates to a substrate manufacturing process of printed wiring board, more particularly to joining technology of thin substrates.

2. Description of the Related Art

If sheet-like shape (plate-like shape) is employed as the shape of a thin substrate such as copper clad laminate in which copper foils are laminated on resin layer thereof, transportation of substrates having a low stiffness is more difficult as the thickness of the substrate decreases. For the reason, the thin substrates are set in a frame jig when they are carried and processed. However, the transportation with this condition is more difficult than transportation of a belt-like substrate using a roller. Particularly, unless a care is paid to handling of the substrates as well as transportation thereof, a work piece (substrate) may be seriously damaged.

If the frame-like transportation jig is used, the effective area of the work piece (substrate) is reduced by an amount corresponding to the area occupied by the transportation jig thereby reducing productivity.

As the core substrate of a built-up multi-layer wiring board, the copper clad laminate in which copper foils are laminated on resin layer is used, and as the resin layer, for example, glass epoxy resin in which epoxy is impregnated in glass cloth core material and polyimide resin are used. Because the polyimide resin can be adjusted easily to a uniform thickness, it allows copper foil to be laminated easily and thus, as the copper clad laminate, reel-like products as well as plate-like (sheet-like) products are manufactured. On the other hand, because the glass epoxy resin is difficult to form into a uniform thickness, the copper foil cannot be laminated thereon and as the copper clad laminate, the plate-like (sheet-like) product and roll-like products are manufactured. Here, JP 2002-141659 A has disclosed technology for joining together a product with another product.

SUMMARY OF THE INVENTION

The embodiments of the present invention have been achieved to solve the above-described problem and an object of the invention is to provide a manufacturing method of printed wiring board which allows the plate-like substrate to be carried without any contact to its product surface and processed. Another object of the invention is to provide a manufacturing method of printed wiring board which can provide manufacturing steps with flexibility so as to raise productivity.

To achieve the above-described objects, the feature of the manufacturing method of the first printed wiring board exits in that the end portions of plate-like laminates each in which metal foil is laminated on resin layer thereof are brought into contact with each other; the contact portion is joined linearly with a joining means so as to obtain a long laminate; and the long laminate is processed.

The feature of the manufacturing method of the first printed wiring board exists in comprising: a step of processing plate-like laminates each in which metal foil is laminated on resin layer thereof; and a step of bringing the end portions of the plate-like laminates into contact with each other, joining the contact portion linearly with a joining means so as to obtain a long laminate and processing the long laminate.

The feature of a laminate joining apparatus exists in that the end portions of the plate-like laminates each in which metal foil is laminated on resin layer thereof are brought into contact with each other and joined linearly by rotating the disc-like ultrasonic horn along the contact portion so as to obtain a long laminate.

Because according to the manufacturing method of the printed wiring board according to a first aspect of the invention, a long laminate is obtained by joining plate-like laminates and then processed, the laminate can be carried and processed without any contact to its product surface as it is carried with the roller. Further, the processable area of a work piece (laminate) can be increased as compared to a case where the surrounding of the plate-like laminate is held with a frame-like jig. Here because the end portions of laminates are brought into contact with each other and joined linearly, joining strength necessary for transportation with a roller can be obtained different from spot joining and further, no chemical agent such as plating solution is left around the joined portion. Further, processing of the end portions can be carried out continuously with the roller thereby raising processing efficiency.

Because according to the manufacturing method of the printed wiring board according to a second aspect of the present invention, the end portions of the plate-like laminates are overlapped vertically, metal foils can be metal-joined and a joining strength necessary for transportation with a roller can be obtained and no chemical agent such as plating solution is left around the joined portion.

Because according to the manufacturing method of the printed wiring board according to a third aspect of the present invention, the end portions of the plate-like laminates are overlapped vertically and joined with ultrasonic, the metal foils can be metal-joined and a joining strength necessary for transportation with a roller can be obtained and no chemical agent such as plating solution is left around the joined portion.

Because according to the manufacturing method of the printed wiring board according to a fourth aspect of the present invention, the end portions of the plate-like laminates are overlapped vertically and joined linearly by rotating a disc-like ultrasonic horn along the end portion, the metal foils can be metal-joined and joining strength necessary for transportation with a roller can be obtained and no chemical agent such as plating solution is left around the joined portion.

Because according to the manufacturing method of the printed wiring board according to a fifth aspect of the present invention, the plate-like laminates are positioned and joined such that the side ends perpendicular to the end portions to be joined are in a straight line, the ends of the long laminates are arranged linearly thereby facilitating transportation with the roller.

Because according to the manufacturing method of the printed wiring board according to a sixth aspect of the present invention, the end portions of the laminates are joined along plural lines with the ultrasonic horn, the contact faces on the end portions overlapped vertically can be joined completely and a high joining strength is obtained and no chemical agent such as plating solution is left around the joined portion.

Because according to the manufacturing method of the printed wiring board according to a seventh aspect of the present invention, the sides of the end portions to be joined of the plate-like laminates are provided with taper, a difference of step at the joined end portions decreases thereby facilitating transportation of the belt-like laminate with a roller.

The manufacturing method of the printed wiring board according to an eighth aspect of the present invention comprises a step of processing the plate-like laminate and a step of processing a long laminate produced by joining the plate-like laminates. Thus, in a step which can process the plate-like laminate more easily, the plate-like laminate is processed and in a step which can process the belt-like laminate more easily, the long laminate is processed thereby facilitating manufacturing of the printed wiring board.

Because according to the manufacturing method of the printed wiring board according to a ninth aspect of the present invention, the plate-like laminate is processed in processing step in which positioning is carried out, the positioning accuracy can be raised. Then, because the long laminate is processed in plating step, plating can be carried out continuously and the laminate can be carried and plated without any contact to its product surface as it is carried with a roller.

In the laminate joining apparatus of a tenth aspect of the present invention, the end portions of the plate-like laminates each in which metal foil is laminated on resin layer thereof are brought into contact with each other and joined linearly by rotating the disc-like ultrasonic horn along the contact portion so as to obtain a long laminate. Thus, the long laminate can be carried and processed without any contact to its product surface when it is carried with the roller.

In the meantime, joining of the plate-like laminates can be achieved by butting the end portions of the plate-like laminates and joining them with a joint tape.

DESCRIPTION OF THE DRAWINGS

FIG. 9(A) is a plan view showing the structure of a cutting unit according to the first embodiment and FIG. 9(B) is a side view thereof;

FIG. 10 is a process diagram showing the manufacturing method of multi-layer printed wiring board according to the first embodiment;

FIG. 11 is a process diagram showing the manufacturing method of multi-layer printed wiring board according to the first embodiment;

FIG. 12 is a process diagram showing the manufacturing method of multi-layer printed wiring board according to the first embodiment;

DESCRIPTION OF THE PREFERRED EMBODIMENTS

The structure of the laminate joining apparatus for use for the manufacturing method of printed wiring board of the present invention will be described with reference to FIGS. 1-3.

Figure 1:
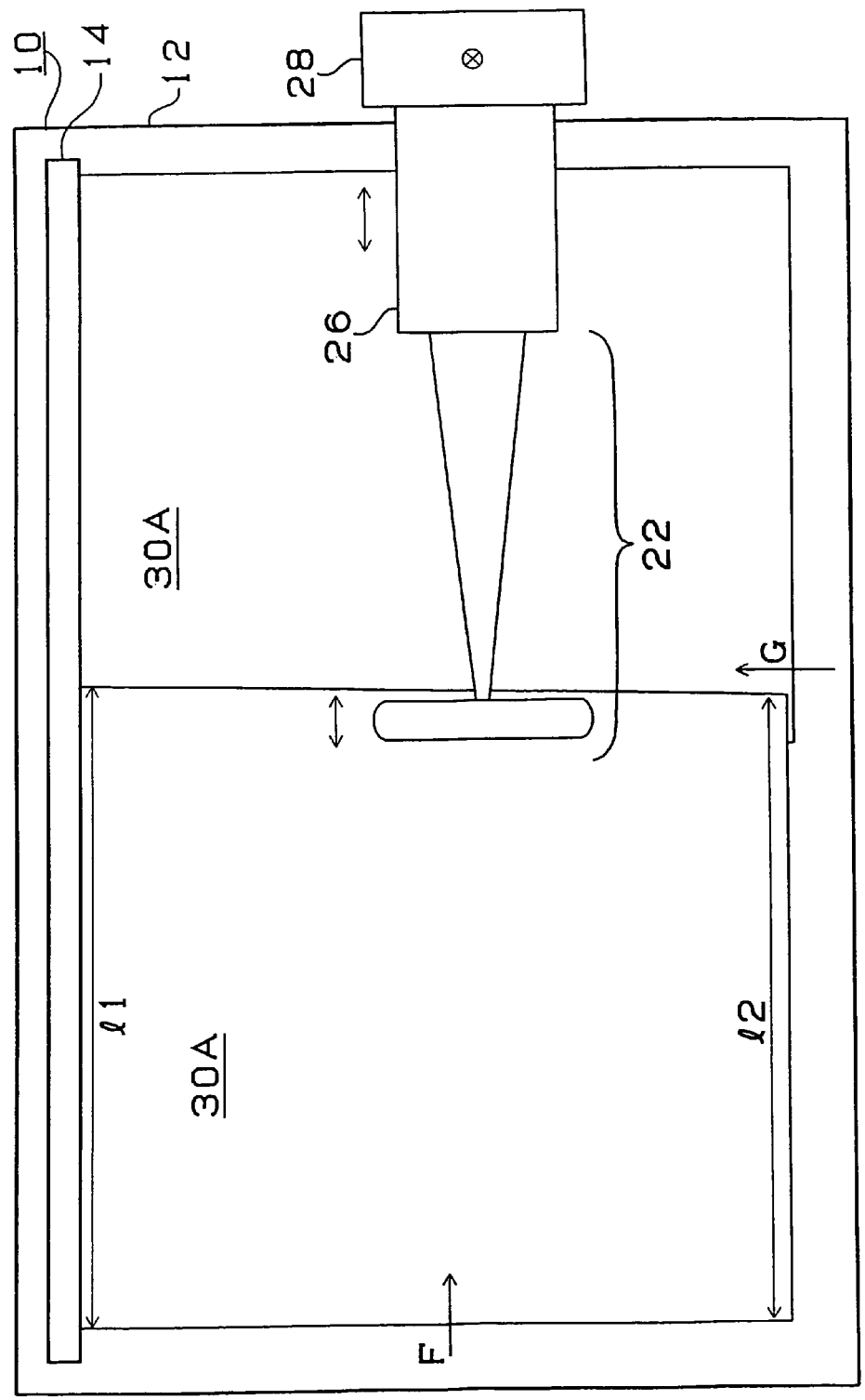
FIG. 1 is a plan view showing the structure of major portions of a laminate joining apparatus 10 according to a first embodiment of the present invention.

FIG. 1 is a plan view showing the structure of major portions of the laminate joining apparatus 10 for joining together plate-like copper clad laminate 30A. FIG. 2 is a sectional view taken along a line indicated with an arrow G of the laminate joining apparatus 10 shown in FIG. 1. FIG. 3 is a sectional view taken along a line indicated with an arrow F of the laminate joining apparatus shown in FIG. 1.

The laminate joining apparatus 10 comprises an anvil 12 which constitutes a support base (jig) for the plate-like copper clad laminate 30A, a positioning plate 14 erected on the anvil 12 and an ultrasonic joining machine 20. The ultrasonic joining machine 20 comprises a horn 22, an ultrasonic oscillator 26 and a pressure plate 28 for pressing the ultrasonic horn 22 against the copper clad laminate 30A. As shown in FIG. 1, the ultrasonic joining machine 20 vibrates an ultrasonic horn 22 at an amplitude of 1-20 µm in the direction of a disc axis. The ultrasonic horn 22 is pressed against the laminate 30A at a force of 1-22 kgf via the pressure plate 28 and it is rotated along a joining portion as shown in FIG. 3. Here, the joining speed can be adjusted in a range of 1-40 mm/s.

The copper clad laminate 30A is produced by laminating copper foil 32 of 3-12 µm thick on both faces of an insulating substrate 30 composed of glass epoxy resin or polyimide resin of 20-60 µm thick. As shown in FIG. 2, an overlapping width W1 between the copper clad laminate and another copper clad laminate is adjusted to about 2 mm or less. As a consequence, an effective area of the copper clad laminate is secured sufficiently.

The copper clad laminates 30A are positioned and joined together by bringing side ends thereof into contact with the positioning plate 14 such that the side ends perpendicular to the end portions to be joined are in a straight line with respect to the positioning plate 14 erected on the anvil 12. Because the length l1 of one side end of the copper clad laminate 30A and the length l2 of the other side end can be different from each other in mm order as shown in FIG. 1, unevenness occurs on the side end of the joined belt-like copper clad laminates 30 when they are joined together with the end portions to be joined as a criterion, so that thereby making it difficult to carry the joined belt-like laminates 30.

Figure 4:
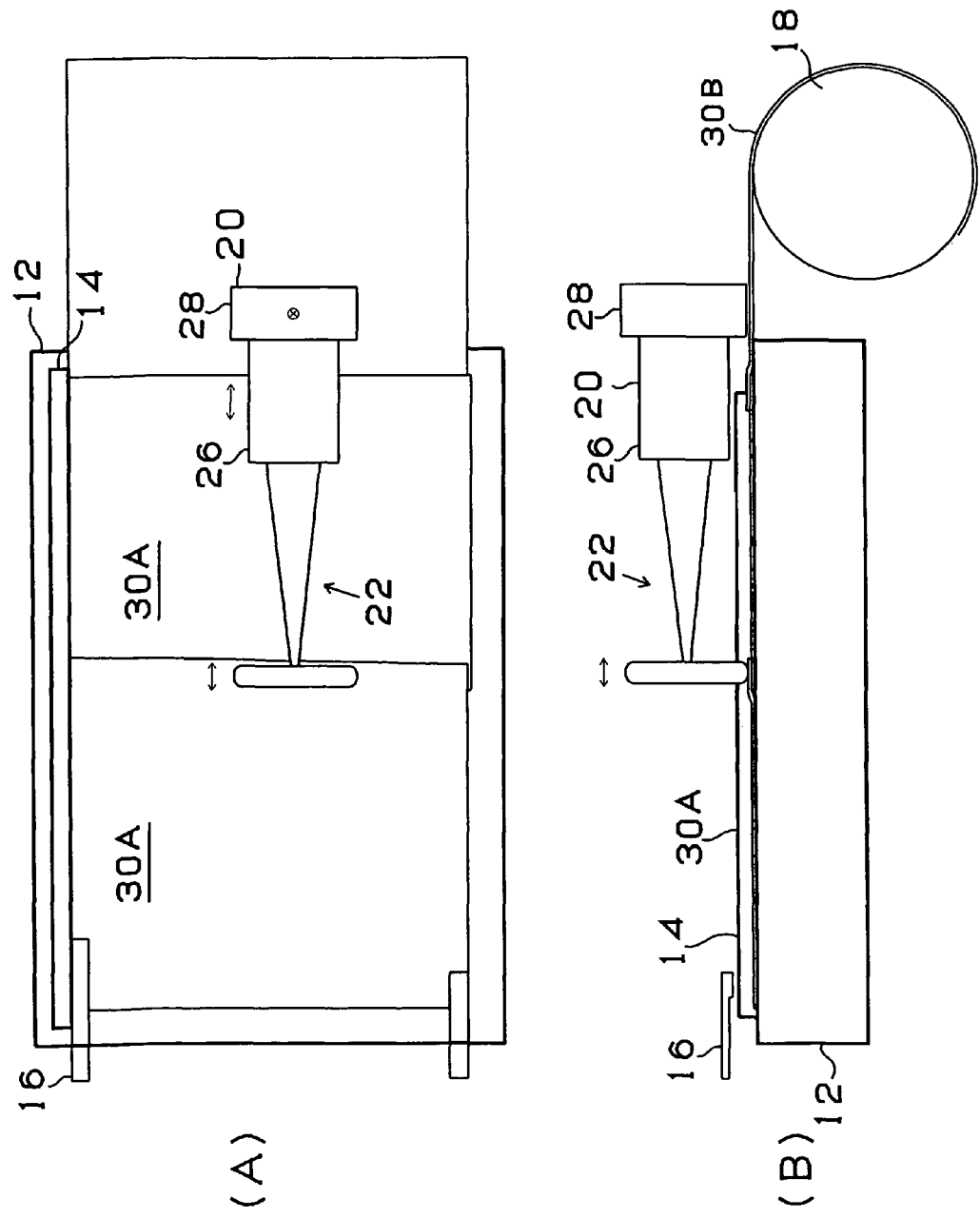
FIG. 4(A) is a plan view showing the entire structure of the laminate joining apparatus 10 according to the first embodiment and FIG. 4(B) is a side view thereof.

FIG. 4(A) is a plan view showing the entire structure of the laminate joining apparatus 10 according to the first embodiment and FIG. 4(B) is a side view thereof. The laminate joining apparatus 10 comprises a roller 18 which winds up belt-like copper clad laminates 30B joined by an ultrasonic joining machine 20 and a carrying unit 16 which carries the plate-like copper clad laminate 30A on the anvil 12 and positions the copper clad laminates 30A with side ends thereof in contact with the positioning plate 14 and can automatically manufacture belt-like copper clad laminate 30B from the plate-like copper clad laminates 30A.

The laminate joining apparatus 10 of the first embodiment can carry with rollers and process the belt-like copper clad laminate 30B without any contact with its product surface because the belt-like copper clad laminate 30B is produced by joining the plate-like copper clad laminates 30A and processed. Further, the processable area of a work piece (laminate) can be expanded as compared to a case of holding the surrounding of the plate-like copper clad laminate with a frame-like jig. Because the laminates are joined linearly by bringing the end portions thereof in contact with each other, a joining strength necessary for transportation with the roller is obtained different from spot joining and no chemical agent like plating solution is left on the joined portion. Additionally, the laminate can be processed continuously with the roller so as to intensify processing efficiency.

Because in the laminate joining apparatus 10 of the first embodiment, the plate-like copper clad laminates 30A are joined linearly by rotating the disc-like ultrasonic horn 22 along the end portion with the end portions of the copper clad laminates overlapped vertically, the copper foils 32 can be metal-joined so that a joining strength necessary for transportation with the rollers can be obtained and no chemical agent such as plating solution is left on the joined portion.

Because in the laminate joining apparatus 10 of the first embodiment, the plate-like copper clad laminates 30A are joined such that the side end perpendicular to the end portions to be joined is in a straight line, an end of the belt-like copper clad laminate 30B is formed linearly so that transportation thereof with the roller is facilitated.

First Modification of First Embodiment

Figure 5:
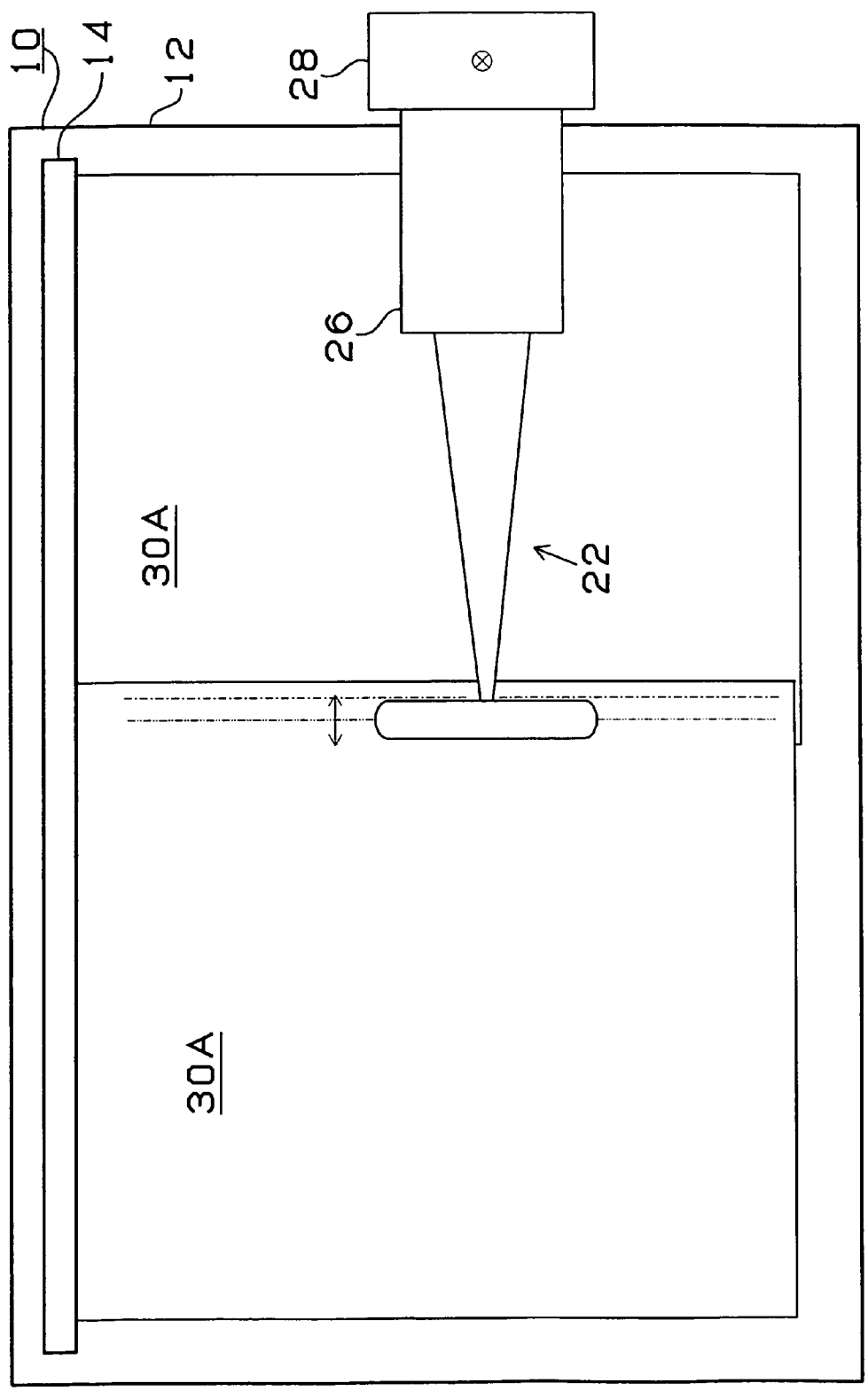
FIG. 5 is a plan view showing the structure of major portions of the laminate joining apparatus 10 according to a first modification of the first embodiment.

FIG. 5 is a plan view of the laminate joining apparatus 10 according to a first modification of the first embodiment. In the first embodiment described with reference to FIG. 1, the joining is carried out linearly once by rotating the ultrasonic horn 22 along an end portion. Contrary to this, according to the first modification of the first embodiment, the joining is carried out linearly by rotating the ultrasonic horn 22 several times along the end portion thereof.

Because according to the first modification of the first embodiment, the end portions of the copper clad laminates 30A are joined linearly by rotating the ultrasonic horn 22 along plural lines, the contact faces of the end portions overlapped vertically can be joined completely so as to obtain a high joining strength and no chemical agent like plating solution is left on the surrounding of the joined portion.

Second Modification of the First Embodiment

Figure 6:
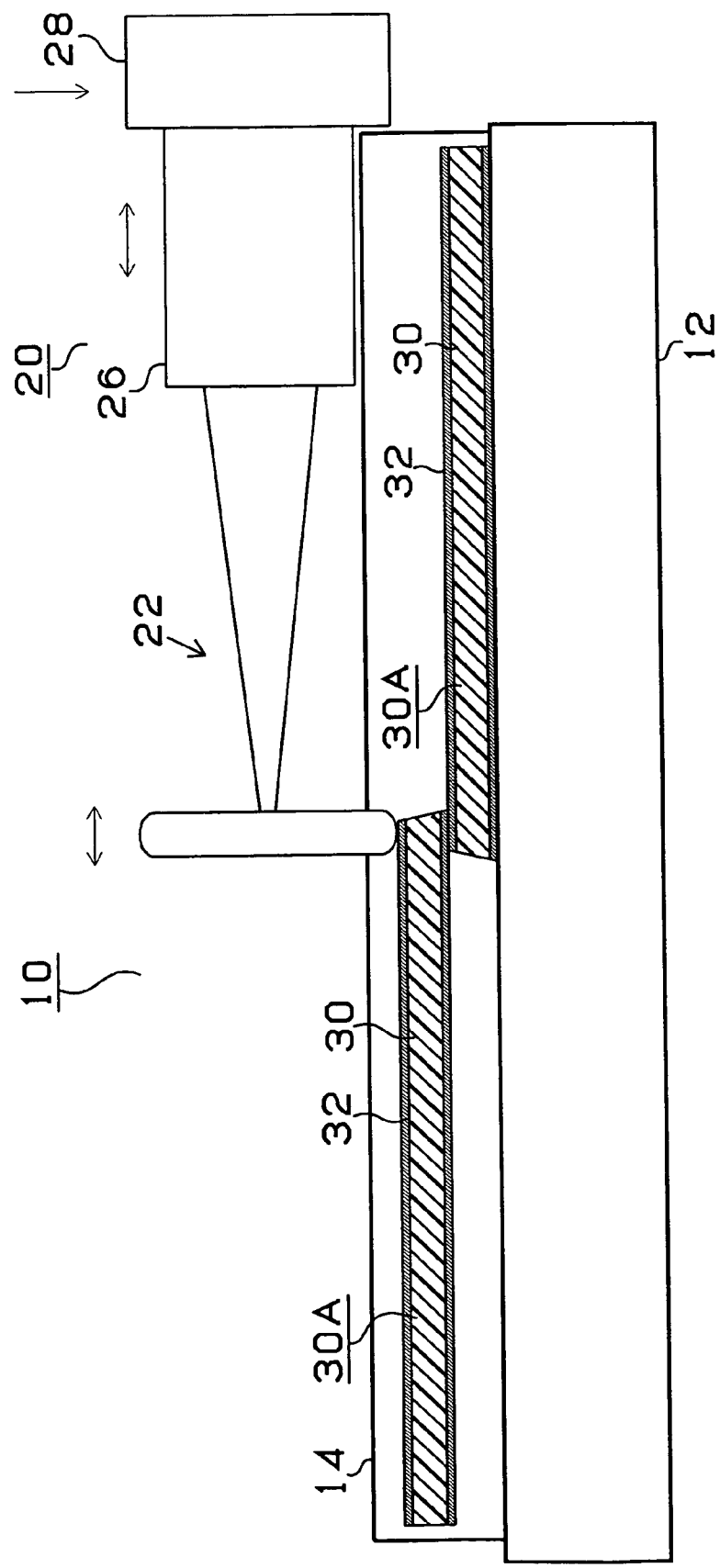
FIG. 6 is a side view of the laminate joining apparatus 10 according to a second modification of the first embodiment.

FIG. 6 shows a side face of the laminate joining apparatus 10 according to the second modification of the first embodiment. In the first embodiment described with reference to FIG. 1, the end portion of the copper clad laminate 30A is cut vertically. Contrary to this, according to the second modification of the first embodiment, the side of the end portion is provided with taper. The taper is formed so that the thickness decreases gradually as it goes toward the side end.

Because according to the second modification of the first embodiment, the side of the end portion to be joined is provided with taper, difference of step at the joined end portion decreases gradually to facilitate transportation of the belt-like copper clad laminate 30B with the roller.

Figure 7:
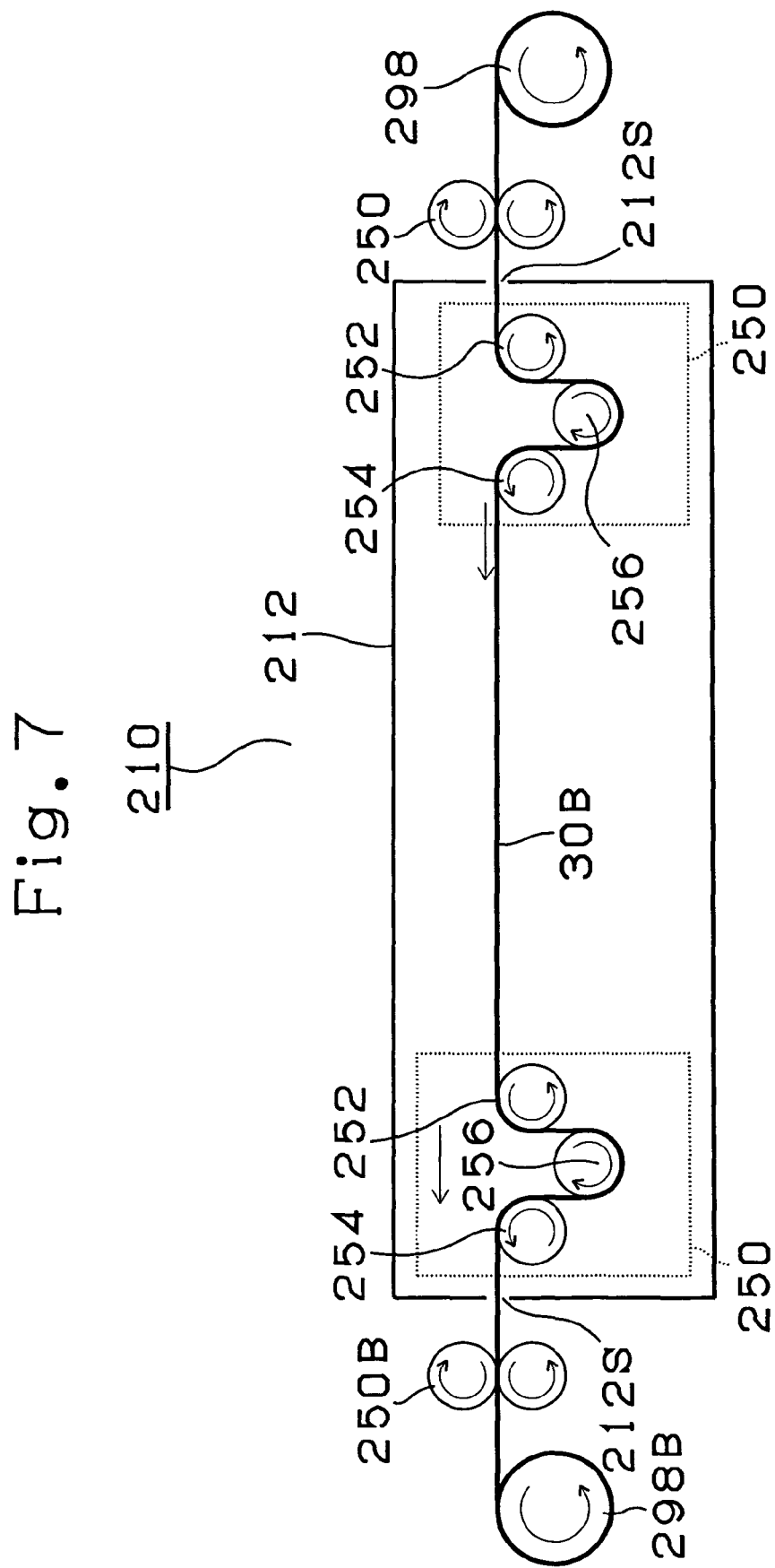
FIG. 7 is an explanatory diagram showing the structure of a plating unit for use in the manufacturing method of the first embodiment.

An example of the structure of a plating apparatus used on plating process picked up as an example of processing to the belt-like copper clad laminate 30B in the manufacturing method of the printed wiring board according to the first embodiment will be described with reference to FIG. 7.

A plating apparatus 210 includes a roller 298 on which the belt-like copper clad laminate 30B is wound, feeding rollers 250 for feeding the copper clad laminate 30B from the roller 298, a plating bath 212 which holds electroless plating solution, feeding rollers 250B for pulling out the copper clad laminate from the plating bath 212 and a roller 298B for winding up the copper clad laminate. The copper clad laminate 30B is carried into the plating bath 212 through a slit 212S. A buffer 250 for adjusting the tension of the copper clad laminate 30B is disposed within the plating bath 212. The buffer 250 is constituted of a pair of fixed rollers 252, 254 and a swing roller 256 which is biased to the direction away from the fixed rollers 252 and 254. Because the fixed rollers 252, 254 and the swing roller 256 are formed in the diameter of about 50 cm, so that the joined portion is not separated even if the belt-like substrate 30A is bent into a semi-circular shape of about 50 cm in diameter. Further, because the plating apparatus applies a tension of about 0.01 kgf/mm to the copper clad laminate, it is preferable to join the copper clad laminates so that they are not separated against a double tension of about 0.02 kgf/mm.

Figure 8:
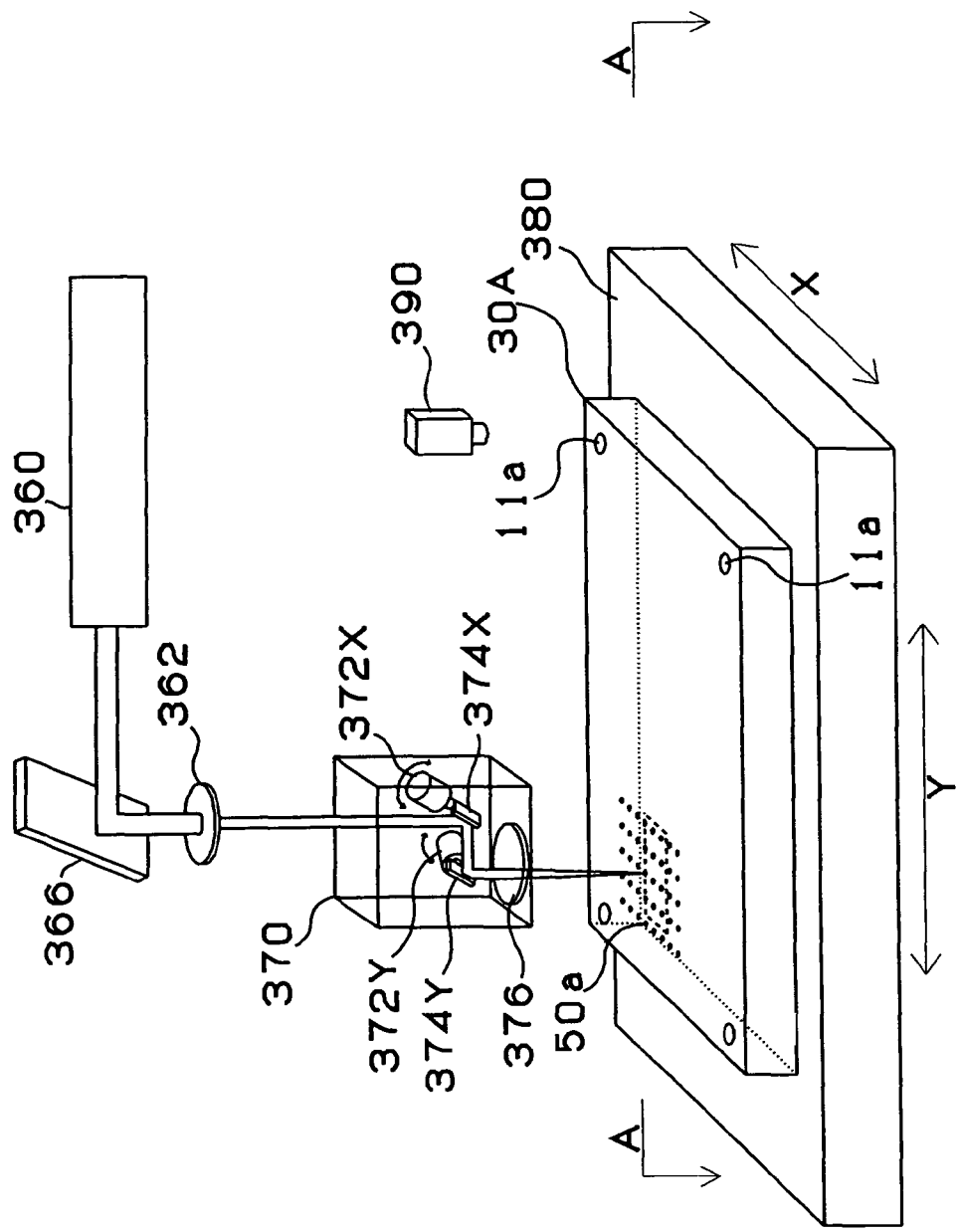
FIG. 8 is a perspective view of a laser processing unit for use in the manufacturing method of the first embodiment.
Figure 13:
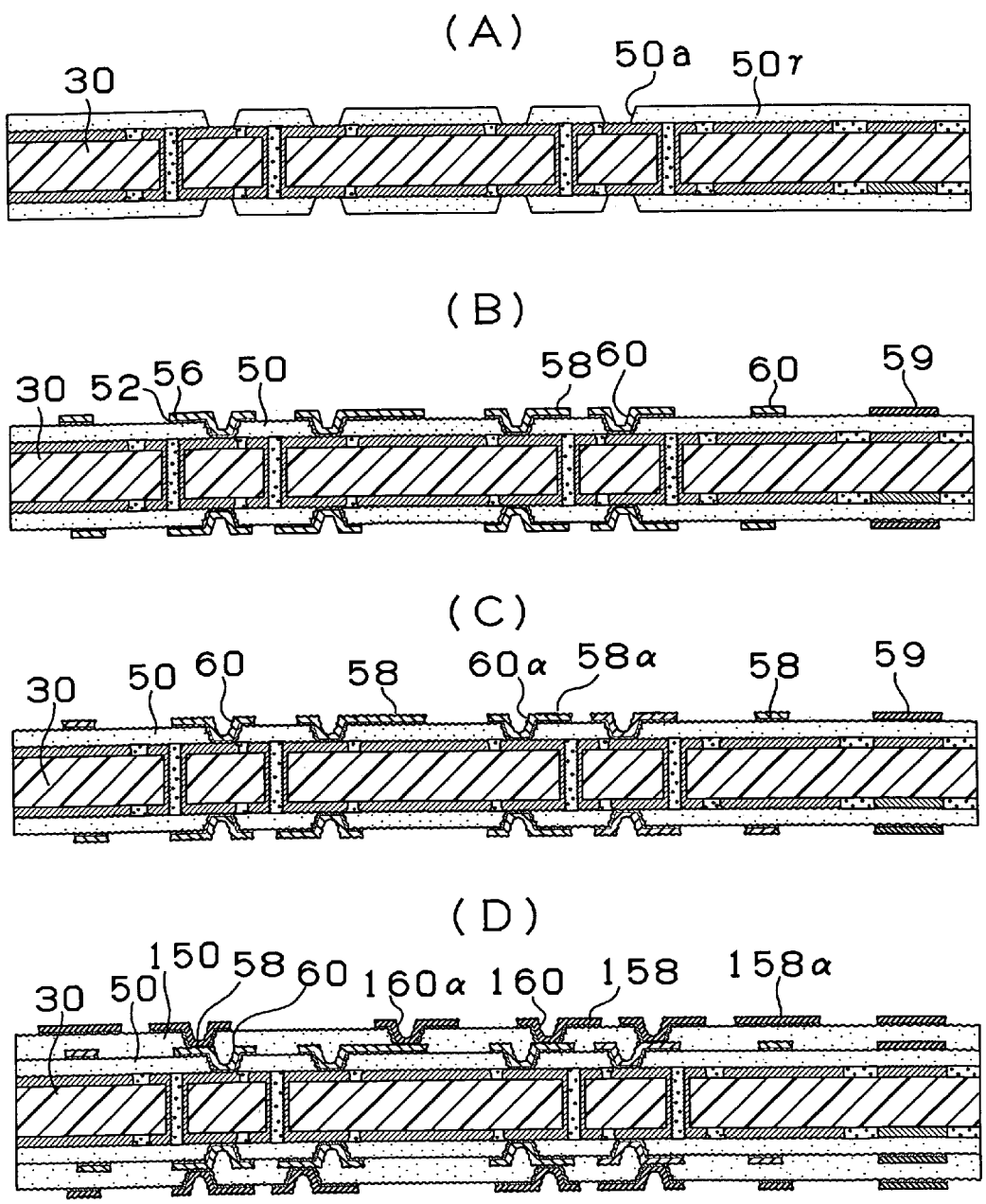
FIG. 13 is a process diagram showing the manufacturing method of multi-layer printed wiring board according to the first embodiment.

Next, the structure of a laser processing apparatus for use in laser processing process picked up as an example of processing applied to the plate-like copper clad laminate 30A in the manufacturing method of the printed wiring board according to the first embodiment will be described with reference to FIG. 8.

According to the first embodiment, the belt-like copper clad laminate is cut out so as to obtain the plate-like copper clad laminate 30A and this laminate 30A is positioned and processed with laser. This laser processing unit utilizes a $CO_2$ laser oscillation unit 360 having a wavelength of about 10.6 μm as a laser source. Light emitted from the laser oscillation unit 360 is reflected by a reflection plate 366 and sent to galvano head through a transfer mask 362 for making the focal point on a substrate clear.

A scanning head (galvano head) 370 includes a galvano mirror comprised of a galvano mirror 374X which scans with laser beam in the X direction and a galvano mirror 374Y which scans with laser in the Y direction in pair and the mirrors 374X, 374Y are driven by control motors 372X, 372Y. The motors 372X, 372Y adjust angles of the mirrors 374X, 372Y corresponding to a control instruction from a computer (not shown) and sends a detection signal from an incorporated encoder to the computer.

The scan area of the galvano mirror is about 30×30 mm. The positioning speed of the galvano mirror is about 400 points/second within the scan area. The laser beam is projected through the two galvano mirrors 374X, 374Y so as to scan in the X and Y directions, so that the laser beam passes through a f-θ lens 376 and strikes an interlayer insulation layer 50 described later of the copper clad laminate 30A to form a via hole (opening) 50a.

The copper clad laminate 30A is placed on a X-Y table 380 which moves in the X and Y directions. The scan area of the galvano mirror of each galvano head 370 is about 30 mm×30 mm as described above and the quantity of step areas of the X-Y table 380 is about 289 (17×17) because the copper clad laminate 30A about 500 mm×500 mm is used. That is, processing of the copper clad laminate 30A is completed by moving by about 30 mm each in the X direction 17 times and in the Y direction 17 times.

The manufacturing unit includes a CCD camera 390, which measures the position of a target mark (positioning mark) 11a disposed on each of four corners of the copper clad laminate 30A and starts processing after an error is corrected.

The structure of a cutting unit for use in cutting process picked up as an example of processing applied to the belt-like copper clad laminate 30B in the manufacturing method of the printed wiring board according to the first embodiment will be described with reference to FIG. 9(A). FIG. 9 is a plan view showing the entire structure of the cutting unit and FIG. 9(B)

is a side view thereof. The belt-like copper clad laminate 30B pulled out from the roller 18 is cut by a cutter 29 constituted of a pair of blades for cutting out the joined portion to separate each plate-like copper clad laminate 30A and carry out with the carrying unit 16.

First Embodiment

Figure 14:
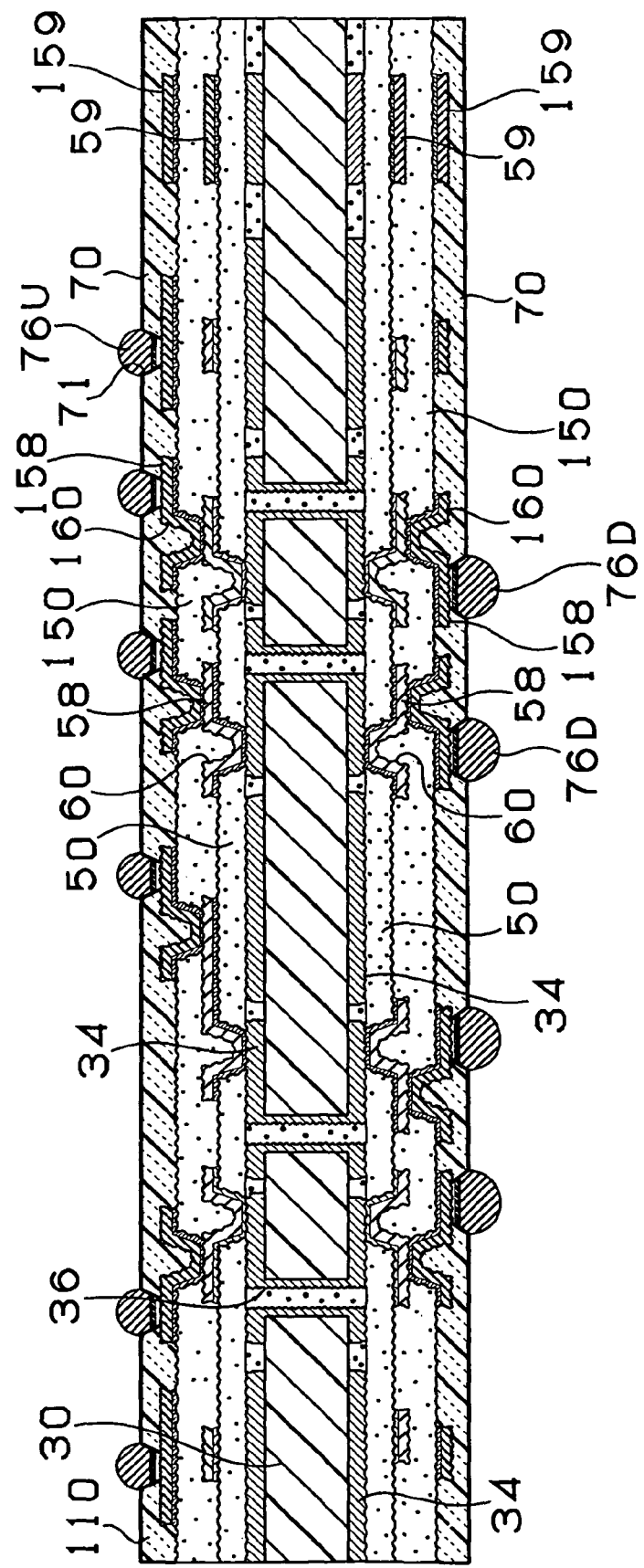
FIG. 14 is a sectional view of the multi-layer printed wiring board according to the first embodiment.

The structure of a multilayered printed wiring board 10 manufactured according to the manufacturing method of the first embodiment of the present invention will be explained with reference to FIGS. 10-14. FIG. 14 is a sectional view of the multilayered printed wiring board 10. Conductor circuit 34 is formed in the surface of a core substrate 30. The conductor circuit 34 on the front surface and the conductor surface 34 on the rear surface are connected via through holes 36. Further, interlayer resin insulating layer 50 in which via holes 60 and conductor circuits 58 are formed and interlayer resin insulating layer 50 in which via holes 160 and conductor circuits 158 are formed are disposed on the conductor circuits 34. Solder resist layer 70 is formed on the top layer of the via hole 160 and the conductor circuits 158 and bumps 76U, 76D are formed on the via holes 160 and the conductor circuits 158 via opening portions 71 in the solder resist layer 70.

Subsequently, the manufacturing method of the multilayered printed wiring board 10 described above with reference to FIG. 14 will be described with reference to FIGS. 10-13.

First Embodiment (1) A plate-like copper clad laminate (about 510 mm in length×about 164 mm in width) 30A in which copper foils 32 of about 12 μm are laminated on both faces of an insulating substrate 30 composed of glass epoxy resin of about 0.6 mm in thickness was used as starting material (FIG. 10(A)).
(2) A belt-like copper clad laminate 30B is obtained by joining plural pieces of the plate-like copper clad laminates 30A using the above-described laminate joining apparatus (UEW-100Z28a: manufactured by Ultrasonic Engineering Co., Ltd.) with reference to FIGS. 1-4 (FIG. 10(B)).

Figure 2:
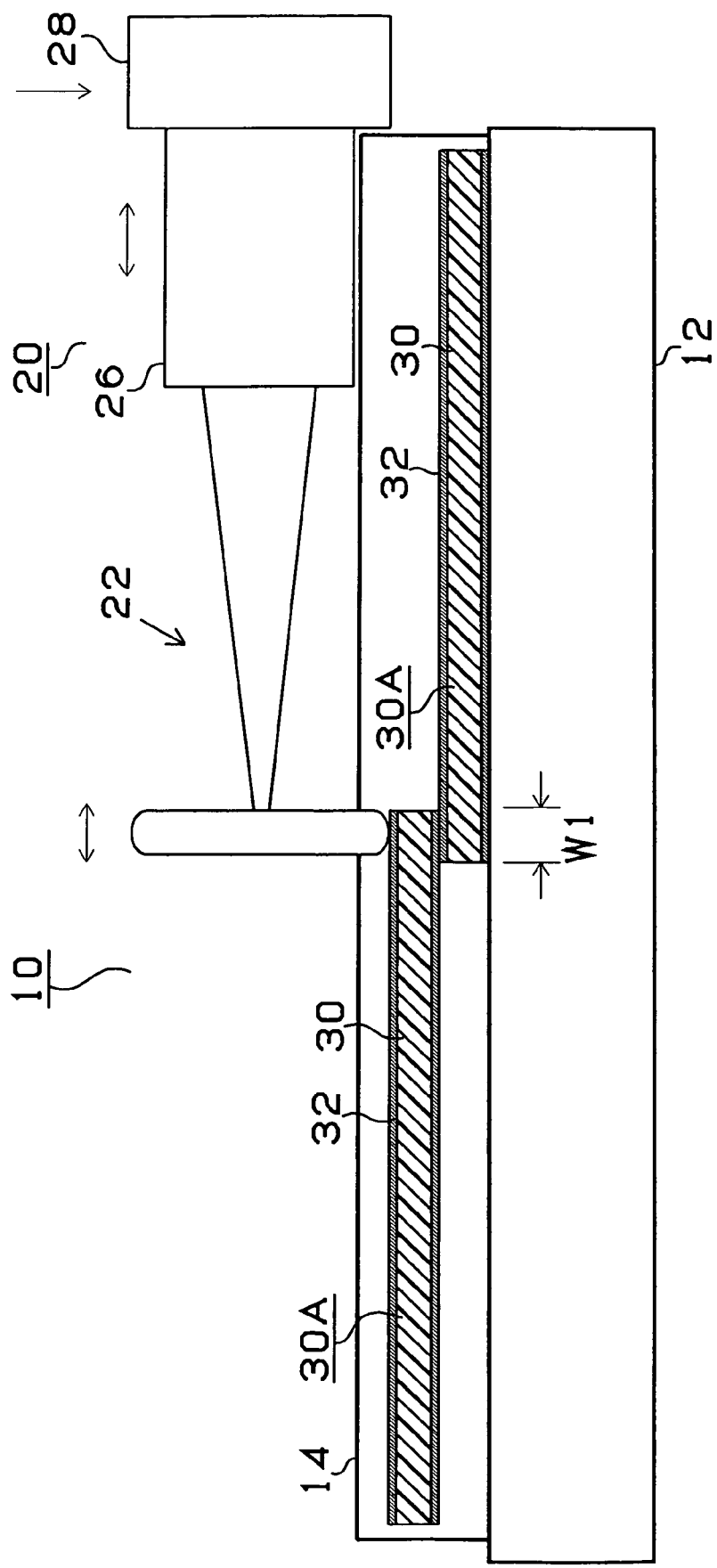
FIG. 2 is a sectional view taken along a line indicated with an arrow G of the laminate joining apparatus 10 shown in FIG. 1.
Figure 3:
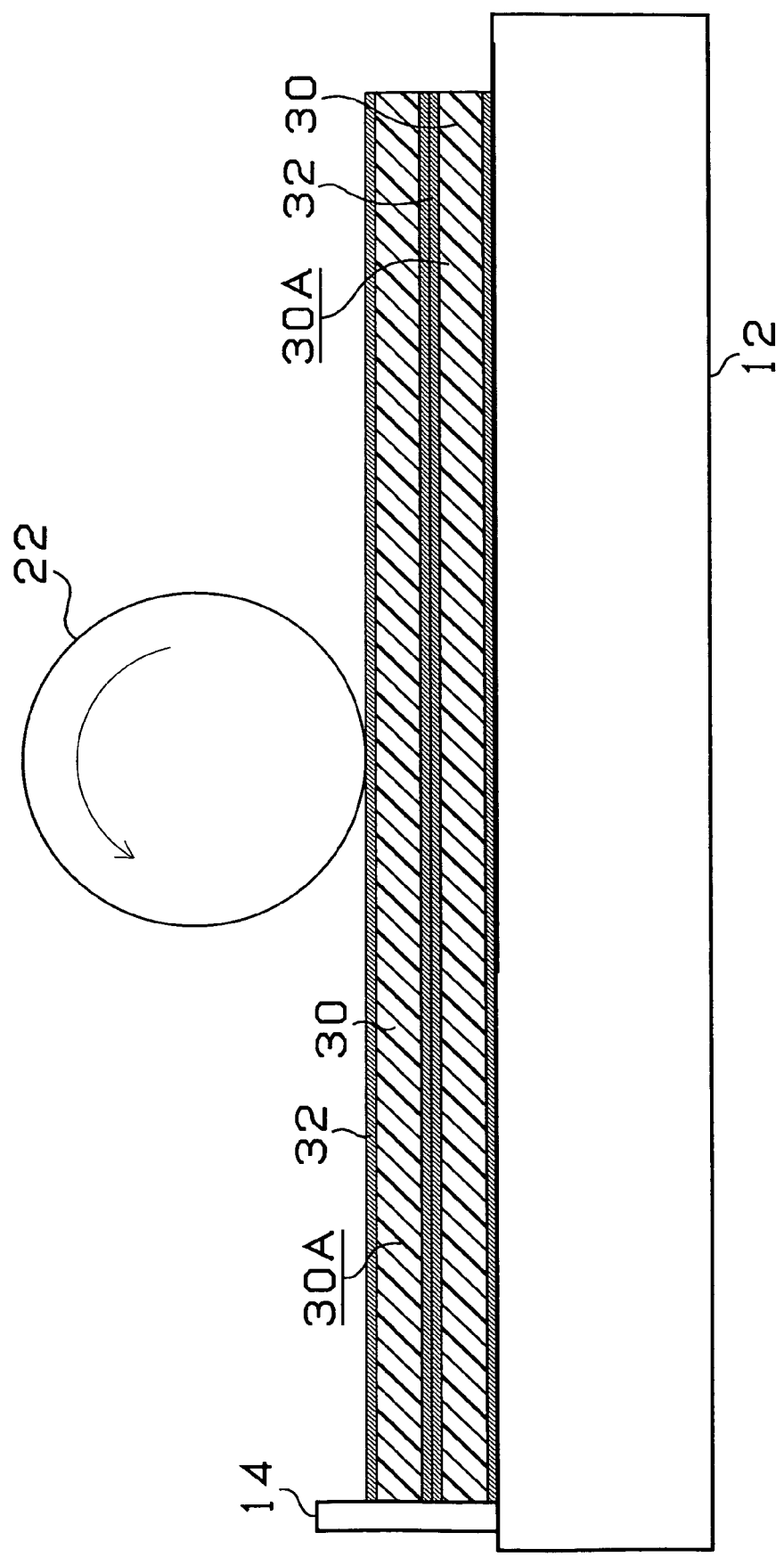
FIG. 3 is a sectional view taken along a line indicated with an arrow F of the laminate joining apparatus 10 shown in FIG. 1.

As joining condition, the ultrasonic horn 22 was vibrated at an amplitude of about 12 μm and the ultrasonic horn 22 was pressed at a load of about 10 kgf, the joining speed was adjusted to about 10 mm/s and then, the overlapping width shown in FIG. 2 was set to about 2 mm. As a result, even if the joined copper clad laminate is bent into a semi-circular shape of about 50 cm in diameter, the joined portion is not separated so that it can bear a tension of up to about 0.1 kgf/mm. In the meantime, the joining condition is not restricted to this example. If speaking more in detail, the amplitude and load are changed appropriately corresponding to the joining strength of the copper clad laminate 30A.
(3) Communication holes 35 for through holes are made in the belt-like copper clad laminate 30B with a drill (FIG. 10(C)).
(4) After electroless copper plating is executed to the communication holes 35 for through holes with the above-described plating unit with reference to FIG. 7, through holes 36 are formed by providing electrolytic plating film (FIG. 10(D)).
(5) Conductor circuit 34 is formed by patterning the copper foil 32 by etching (FIG. 11(A)).
(6) Roughened face 34α was formed on the surface of the wiring pattern 34 and through hole 36 by black oxide processing and reduction processing (FIG. 11(B)).
(7) Next, through hole charging resin composition 40γ was charged in between the conductor circuits 34 and 34 and in the through holes 36 using a squeegee and then dried (FIG. 11(C)). The substrate surface was polished to a flat surface until land surfaces of the conductor circuits 34 and through holes 36 are exposed and the through hole charging resin composition 40 γ was hardened by heat treatment so as to form resin charging material layer 40 (FIG. 12(A)).
(8) After the substrate was washed with water and degreased with acid, soft etching was carried out and then, etching solution was sprayed to both faces of a substrate and the roughened face 34β was formed on the entire surface of the conductor circuit by etching the surface of the conductor circuit 34 and the land surface and inner wall of the through holes 36 (FIG. 12(B)).
(9) Next, interlayer insulating resin film 50 was bonded by vacuum pressure bonding lamination at about 0.5 MPa while raising the temperature up to 50-150° C.
(10) The belt-like copper clad laminate 30B described with reference to FIG. 9 was cut out by a cutting unit at the joined portion so as to produce the plate-like copper clad laminate 30A (FIG. 12(D)).
(11) Next, the plate-like copper clad laminate 30A was positioned to the laser unit described above with reference to FIG. 8 so as to form the opening 50a for the via hole having a diameter of about 80 μm (FIG. 13(A)).
(12) Next, heat treatment was carried out to harden the interlayer insulating resin film 50γ completely to form the interlayer resin insulating layer 50 and consequently, the conductor circuits 58 and via holes 60 composed of electroless plating film 52 and electrolytic plating film 56 were formed (FIG. 13(B)). Further, black oxide processing and reduction processing were carried out to form a roughened face 58α on the surface of the conductor circuit 58 and a roughened face 60α on the surface of the via hole 60 (FIG. 13(C)).
(13) The upper interlayer insulating layer 150 was formed to form the conductor circuits 158 and the via holes 160. Further, the roughened face 158α was formed on the surface of the conductor circuits 158 and the roughened face 160α was formed on the surface of the via holes 160 (FIG. 13(D)).
(14) The solder resist layer 70 having the opening 71 was formed on both faces of the substrate and solder paste was printed within the opening 71 and then solder bumps 76U, 76D were formed by reflow so as to form a printed wiring board having the solder bumps (FIG. 14).

The manufacturing method of the printed wiring board according to the first embodiment can raise positioning accuracy because the plate-like copper clad laminate 30A is processed in laser processing process for positioning. Then, in the plating process, plating can be carried out continuously because the belt-like copper clad laminate 30B is processed and because the laminate is carried with the roller, it can be carried and plated without any contact to its product surface.

Although the invention has been disclosed in the context of a certain preferred embodiments, it will be understood that the present invention extends beyond the specifically disclosed embodiments to other alternative embodiments of the invention. Thus, it is intended that the scope of the invention should not be limited by the disclosed embodiments but should be determined by reference to the claims that follow.

What is claimed is:

1. A manufacturing method of a printed wiring board, comprising:
   providing a plurality of plate-like laminates each comprising a resin layer, a first metal foil laminated to one side of the resin layer, and a second metal foil laminated to an opposite side of the resin layer;
   bringing the plate-like laminates into contact with each other such that adjacent ones of the plate-like laminates form contact portions with end portions of the plate-like laminates contacting each other such that a surface of the first metal foil of one plate-like laminate directly contacts a surface of the second metal foil of an adjacent plate-like laminate;

linearly joining the contact portions of the plate-like laminates formed by repeating the bringing of the plate-like laminates so as to obtain a long laminate comprising the plurality of plate-like laminates joined in repetition and to successively extend a length of the long laminate;

winding up the long laminate onto a roller as the length of the long laminate is continuously added by repeating the bringing of the plate-like laminates and the joining of the contact portions of the plate-like laminates; and processing the long laminate comprising the plate-like laminates.

2. The manufacturing method of the printed wiring board according to claim 1, wherein the bringing of the plate-like laminates comprises bringing the end portions of the plate-like laminates into contact with each other such that the end portions of the plate-like laminates are overlapped vertically.

3. The manufacturing method of the printed wiring board according to claim 2, wherein the bringing of the plate-like laminate into contact comprises positioning the plate-like laminates such that side ends of the plate-like laminates perpendicular to the end portions of the plate-like laminates are in a straight line.

4. The manufacturing method of the printed wiring board according to claim 2, further comprising tapering the end portions of the plate-like laminates.

5. The manufacturing method of the printed wiring board according to claim 2, wherein the joining of the plate-like laminates comprises ultrasonic joining of the end portions of the plate-like laminates.

6. The manufacturing method of the printed wiring board according to claim 5, wherein the bringing of the plate-like laminate into contact comprises positioning the plate-like laminates such that side ends of the plate-like laminates perpendicular to the end portions of the plate-like laminates are in a straight line.

7. The manufacturing method of the printed wiring board according to claim 5, further comprising tapering the end portions of the plate-like laminates.

8. The manufacturing method of printed wiring board according to claim 5, wherein the joining comprises joining the contact portions of the plate-like laminates with a joining device, and the joining device comprises a disc-like ultrasonic horn configured to rotate along the end portions of the plate-like laminates such that the ultrasonic joining is executed to linearly join the end portions of the plate-like laminates overlapped vertically.

9. The manufacturing method of the printed wiring board according to claim 8, wherein the joining of the plate-like laminates comprises linearly joining the end portions of the laminates along a plurality of lines with an ultrasonic horn.

10. The manufacturing method of the printed wiring board according to claim 1, wherein the bringing of the plate-like laminate into contact comprises positioning the plate-like laminates such that side ends of the plate-like laminates perpendicular to the end portions of the plate-like laminates are in a straight line.

11. The manufacturing method of the printed wiring board according to claim 1, further comprising tapering the end portions of the plate-like laminates.

12. The manufacturing method of the printed wiring board according to claim 1, further comprising forming an insulating resin film extending over the length of the long laminate on a surface of the long laminate comprising the plate-like laminates.

13. The manufacturing method of the printed wiring board according to claim 1, wherein each of the first metal foil and the second metal foil is a copper foil.

14. The manufacturing method of the printed wiring board according to claim 1, wherein the first metal foil substantially covers the one side of the resin layer, and the second metal foil substantially covers the opposite side of the resin layer.

15. A manufacturing method of a printed wiring board comprising:

providing a plurality of plate-like laminates each comprising a resin layer, a first metal foil laminated to one side of the resin layer, and a second metal foil laminated to an opposite side of the resin layer;

processing the plate-like laminates;

bringing the plate-like laminates into contact with each other such that adjacent ones of the plate-like laminates form contact portions with end portions of the plate-like laminates contacting each other such that a surface of the first metal foil of one plate-like laminate directly contacts a surface of the second metal foil of an adjacent plate-like laminate;

linearly joining the contact portions of the plate-like laminates formed by repeating the bringing of the plate-like laminates so as to obtain a long laminate comprising the plurality of plate-like laminates joined in repetition and to successively extend a length of the long laminate;

winding up the long laminate onto a roller as the length of the long laminate is continuously added by repeating the bringing of the plate-like laminates and the joining of the contact portions of the plate-like laminates; and processing the long laminate comprising the plate-like laminates.

16. The manufacturing method of the printed wiring board according to claim 15, wherein the processing of the long laminate comprises plating the long laminate, and the processing of the plate-like laminates comprises positioning the plate-like laminates prior to the bringing the plate-like laminates into the contact.

17. The manufacturing method of the printed wiring board according to claim 15, further comprising forming an insulating resin film extending over the length of the long laminate on a surface of the long laminate comprising the plate-like laminates.

18. The manufacturing method of the printed wiring board according to claim 15, wherein each of the first metal foil and the second metal foil is a copper foil.

19. The manufacturing method of the printed wiring board according to claim 15, wherein the first metal foil substantially covers the one side of the resin layer, and the second metal foil substantially covers the opposite side of the resin layer.

* * * * *